United States Patent [19]
Partlo

[11] Patent Number: 5,844,727
[45] Date of Patent: Dec. 1, 1998

[54] ILLUMINATION DESIGN FOR SCANNING MICROLITHOGRAPHY SYSTEMS

[75] Inventor: William N. Partlo, San Diego, Calif.

[73] Assignee: Cymer, Inc., San Diego, Calif.

[21] Appl. No.: 921,494

[22] Filed: Sep. 2, 1997

[51] Int. Cl.$^6$ ............................ G02B 3/06; G02B 27/10; G03B 27/54

[52] U.S. Cl. ..................... 359/710; 359/622; 359/623; 359/628; 355/67

[58] Field of Search .................................. 359/619, 623, 359/628, 710, 713–715, 621, 622; 355/50, 53, 54, 67, 77

[56] References Cited

U.S. PATENT DOCUMENTS

| | | | |
|---|---|---|---|
| 3,947,084 | 3/1976 | Noyes | 350/2 |
| 4,477,185 | 10/1984 | Berger et al. | 356/152 |
| 4,516,832 | 5/1985 | Jain et al. | 385/121 |
| 4,676,581 | 6/1987 | Roberts | 350/1.3 |
| 4,924,257 | 5/1990 | Jain | 355/53 |
| 5,052,763 | 10/1991 | Singh et al. | 359/355 |
| 5,136,413 | 8/1992 | MacDonald et al. | 359/213 |
| 5,142,132 | 8/1992 | MacDonald et al. | 250/201.9 |
| 5,194,893 | 3/1993 | Nishi | 355/53 |
| 5,621,499 | 4/1997 | Shiozawa | 355/67 |
| 5,724,122 | 3/1998 | Oskotsky | 285/67 |

OTHER PUBLICATIONS

Jere D. Buckley, et al., "Step–and–scan lighography using reduction optics," J. Vac. Sci. Technol. B7(6) Nov./Dec. 1989, pp. 1607–1612.

Primary Examiner—Georgia Epps
Assistant Examiner—Jordan M. Schwartz
Attorney, Agent, or Firm—Brian D. Ogonowsky

[57] ABSTRACT

In one embodiment, the illumination system for a scanner incorporates an excimer laser whose square beam is incident upon a two-dimensional array of lenses. The light exiting the array is made incident on a long focal length lens for creating nearly parallel rays. The combination of the array and the long focal length lens causes the resulting square beam at the focal plane of the long focal length lens to have a substantially uniform intensity across its area. An array of cylindrical lenses receives these nearly parallel rays. The light output of the cylindrical lens array is then made incident on a first positive lens whose focal length is longer than the distance between the cylindrical lens array and the first positive lens. A second positive lens is located of the focal plane of the first positive lens. This results in all light rays from the cylindrical lenses which have the same angle to be focused at the same point on the second positive lens. The light incident upon the second positive lens has a long vertical dimension and a short horizontal width dimension. The oblong beam is further adjusted and redirected as necessary to illuminate a reticle.

16 Claims, 3 Drawing Sheets

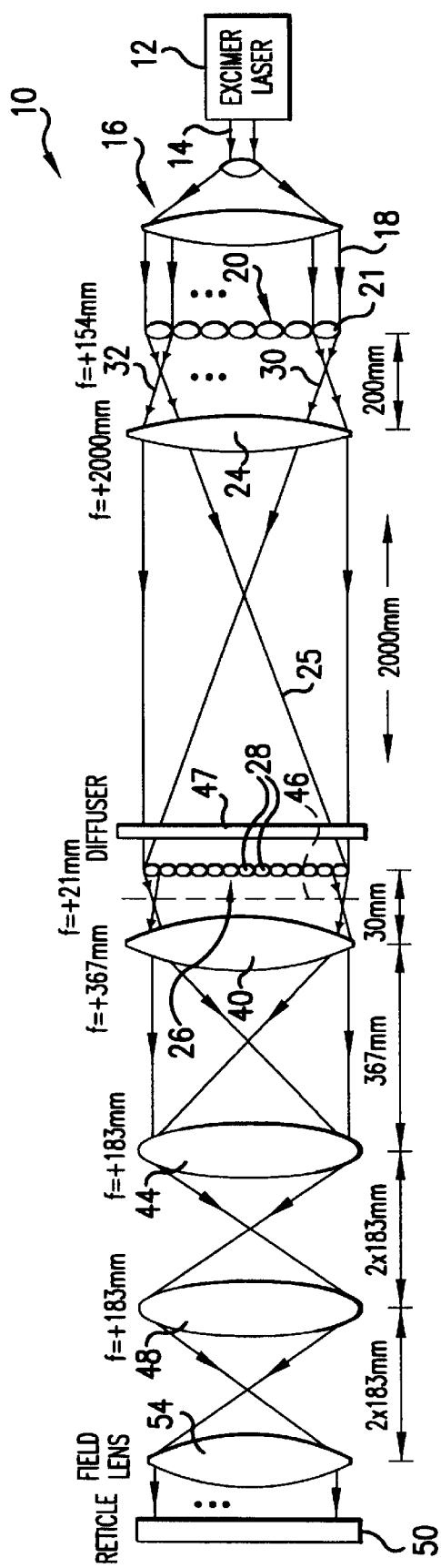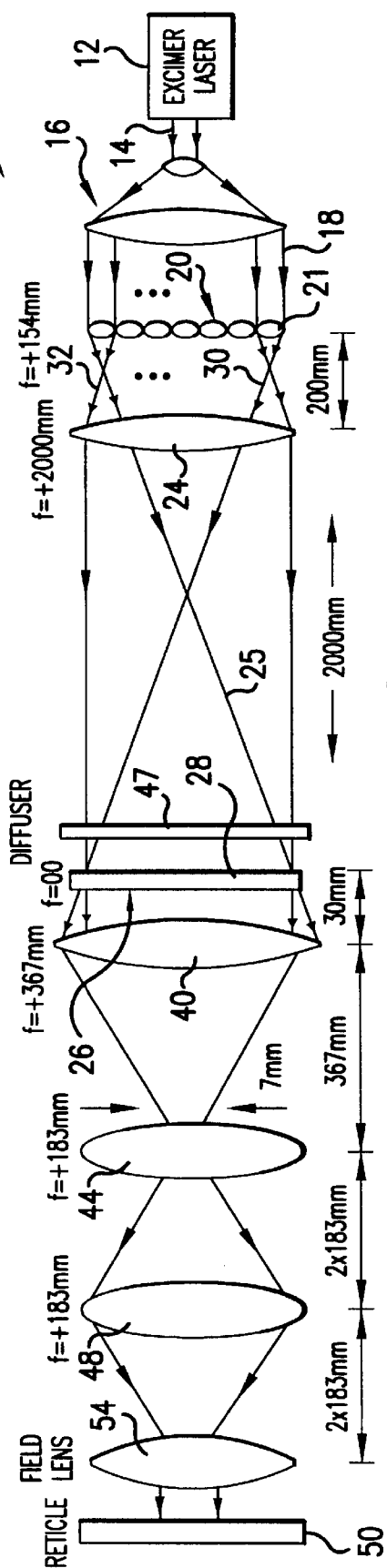

13 GROUPS

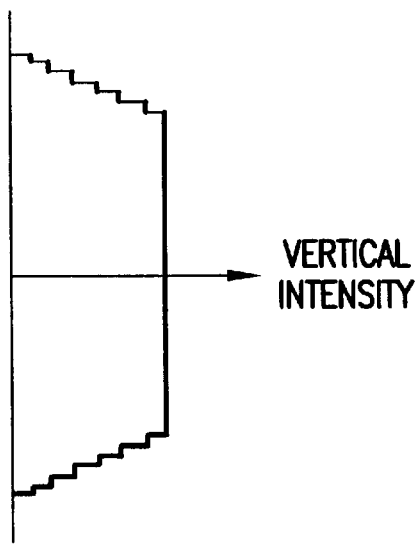
FIG.9
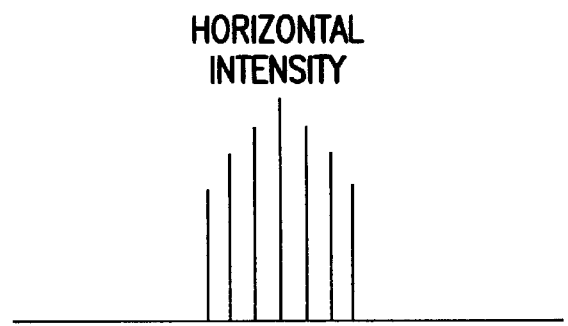
FIG.10
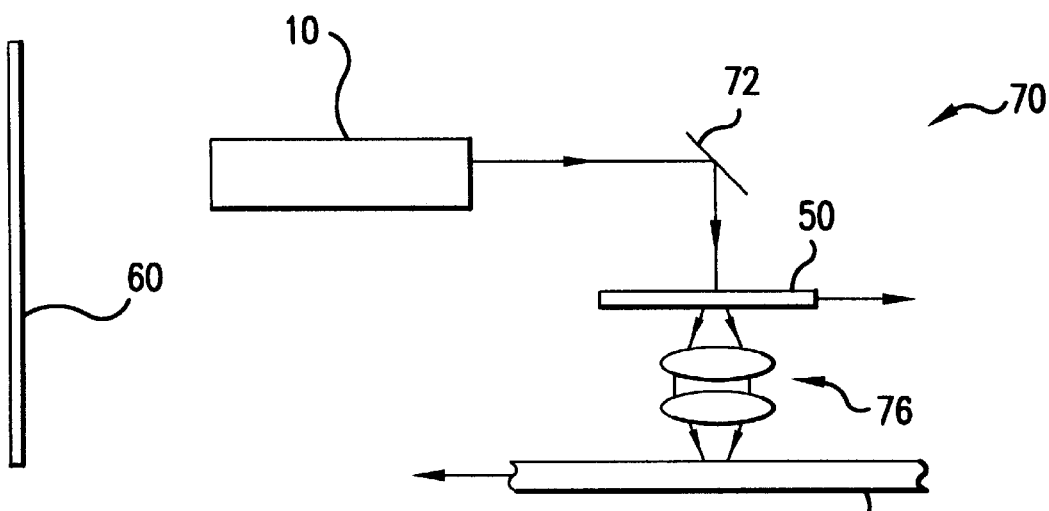
FIG.11
FIG.12

ILLUMINATION DESIGN FOR SCANNING MICROLITHOGRAPHY SYSTEMS

FIELD OF THE INVENTION

This invention relates to optics and, in particular, to an optical system for use in a scanner for processing semiconductor wafers.

BACKGROUND

In certain types of semiconductor wafer fabrication systems, a source of light illuminates a reticle (or mask), and the pattern on the reticle is then focused on the wafer surface to expose a layer of photoresist. In one type of exposure system, the illumination light is a relatively narrow strip of light which is then scanned across the reticle to expose the photoresist on the wafer.

State-of-the-art wafer fabrication systems also incorporate a step-and-repeat exposure system, where a pattern from a reticle is illuminated on only a portion of the wafer surface to expose the photoresist layer. The wafer is then stepped with respect to the reticle pattern such that, ultimately, the entire wafer is exposed to the reticle pattern. A scanning exposure technique may be used in conjunction with such a step-and-repeat type system.

As is well known, the illumination of the reticle in a scanning system must be uniform to obtain an accurate and predictable pattern on the wafer. That is, the light intensity incident on the reticle must ideally be the same at all positions along the reticle, perpendicular to the scanning direction, as well as exhibiting equal energy weighting versus incident angle. Such light characteristics ensure that all areas on the wafer will be identically exposed by the reticle pattern.

Various optical systems have been employed between the light source and the reticle in an attempt to obtain more uniform illumination. Due to nonuniformity in the light output by the light source, such as a laser, it is very difficult to obtain substantially uniform illumination of the reticle.

The present invention is an illumination design for a scanning microlithography system which provides a substantially uniform illumination of the reticle.

SUMMARY

In one embodiment, the illumination system for a scanner incorporates an excimer laser whose square beam is incident upon a two-dimensional array of lenses. The light exiting the array is made incident on a long focal length lens for creating nearly parallel rays. The combination of the array and the long focal length lens causes the resulting square beam at the focal plane of the long focal length lens to have a substantially uniform intensity across its area.

An array of cylindrical lenses receives these nearly parallel rays. It will be assumed for purposes of this discussion that the cylindrical lenses are arranged so that their main axes are horizontal, such that there is one cylindrical lens per horizontal row in the array. A side view would reveal the ends of each of the cylindrical lens. The cylindrical lens array then focuses the light down to a set of narrow horizontal strips of light, where each of the strips is created by one of the cylindrical lenses. In one embodiment, the focal length for each cylindrical lens in the vertical plane is approximately 21 mm, and the focal length along the horizontal plane is infinity.

The light output of the cylindrical lens array is then made incident on a first positive lens whose focal length is longer than the distance between the cylindrical lens array and the first positive lens. A second positive lens is located at the focal plane of the first positive lens. This results in all light rays from the cylindrical lenses which have the same angle to be focused at the same point on the second positive lens.

The light incident upon the second positive lens has a long vertical dimension and a short horizontal width dimension.

The remaining stages of the optical system adjust the size of the strip of illumination and redirect the illumination, as appropriate, to illuminate a reticle in a scanning system and to meet the optical requirements of the projection optics (for focusing the reticle pattern on the wafer).

The resulting beam is a long narrow strip of uniform intensity, which is made incident upon the reticle in the scanning system. The reticle and the wafer are moved relative to the illumination to expose the wafer.

BRIEF DESCRIPTION OF THE DRAWINGS

FIG. 1A is a side view of one embodiment of the illumination system, assuming scanning is in a horizontal direction.

FIG. 1B is a top down view of the illumination system depicted in FIG. 1A.

FIG. 9 illustrates the intensity of light incident upon lens 44 in FIG. 1A along the vertical dimension.

FIG. 10 illustrates the intensity of light incident upon lens 44 in FIG. 1B in the horizontal dimension.

FIG. 11 is a front view of the illumination light created using the invention.

FIG. 12 illustrates a scanner incorporating the present invention.

DETAILED DESCRIPTION OF THE EMBODIMENTS

Figure 2:
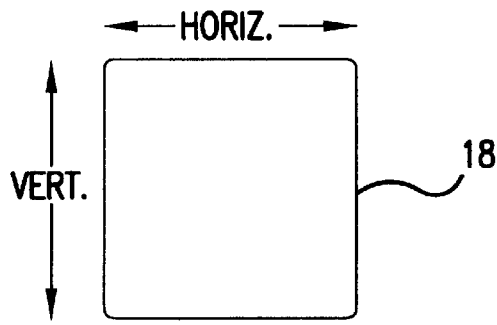
FIG. 2 is a front view of the square beam generated by a laser after anamorphic expansion.

Although the orientation of the oblong beam created using the present invention is arbitrary, it will be assumed for purposes of this disclosure that the optical train is arranged along a single axis, and the oblong illumination pattern has its long length dimension being vertical and its short width dimension being horizontal. Assuming this particular orientation, FIG. 1A is a side view of the preferred illumination system 10 for a scanner, and FIG. 1B is a top view of the same illumination system.

In one embodiment, the light source is a pulsed excimer laser 12 which outputs an ultraviolet laser beam. In one embodiment, the pulse frequency is on the order of 1,000 Hz. However, any light source whose energy output is substantially collimated may be used with the optical train.

Typically, laser 12 generates a beam 14 whose shape must first be modified to optimally use the optical train. In one embodiment, the laser beam 14 has a vertical height of 16 mm and a horizontal width of 4 mm. Since it is desirable in the present embodiment to use a square beam, a conventional lens system 16, forming an anamorphic expander, is used to convert the output of laser 12 into a substantially square beam. In one embodiment, the lens system 16 forming the expander magnifies the height of the beam by 2.5 times and the width of the beam by 10 times to achieve a square beam 18 (FIG. 2) having the dimensions of approximately 42 mm×42 mm.

Figure 3:
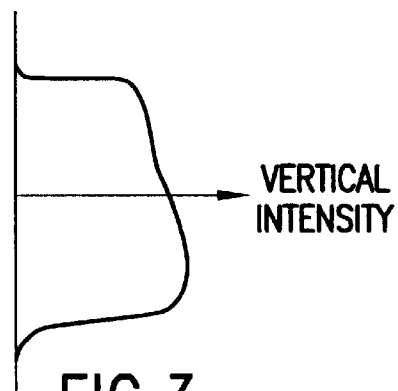
FIG. 3 illustrates the nonuniform light intensity along the vertical dimension of the beam shown in FIG. 2.
Figure 4:
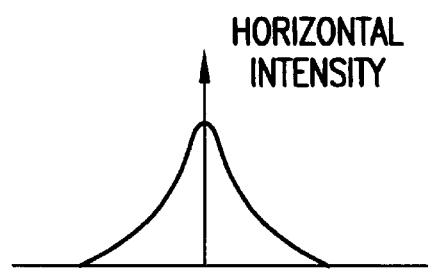
FIG. 4 illustrates the nonuniform light intensity of the beam along the horizontal dimension of the beam shown in FIG. 2.

This substantially parallel beam 18 is then applied to a 7×7 lens array 20. In one embodiment, each lens 21 in array 20 has a diameter of 6 mm and a focal length of +154 mm. Larger or smaller arrays are acceptable; however, tradeoffs must be made as would be understood by those skilled in the art after reading this disclosure. The function of lens array 20 is to effectively average out the intensity variations of beam 18 across its vertical height and horizontal width, as will be later described. FIG. 2 is a front view of the square laser beam 18 showing the vertical and horizontal dimensions. FIG. 3 is a graph of the intensity along the vertical dimension of beam 18 showing the nonuniformity of intensity. FIG. 4 is a graph of the intensity along the horizontal dimension of beam 18 showing the nonuniformity of intensity.

Each of the 49 lenses in array 20 creates a small spot of light, or point source, at one focal distance away (154 mm), where the intensity of each point source is proportional to the light incident on the associated lens. These lenses in array 20 create well controlled angular cones, since the cone angle depends only on the focal length of the lens, which is well controlled during fabrication, and the divergence of the beam 18 which is much smaller than the angle created by the lenses. With this arrangement, changes in the divergence of the laser beam 18 are only small pertubations of the much larger cone angle of rays created by each lens in the 7×7 array 20.

A lens 24 having a long focal length, such as 2,000 mm, is located slightly beyond the focal plane of array 20. Assuming, the focal length of each of the lenses making up lens array 20 is +154 mm, in one embodiment, lens 24 is located approximately 200 mm from lens array 20; however, this distance is arbitrary. The focal length of lens 24 should be as long as practical because this will lead to nearly parallel rays exiting lens 24. The diameter of lens 24 is 60 mm. In other embodiments, the focal length of lens 24 is greater than approximately 1000 mm, and the distance between lens 24 and array 20 is greater than the focal length of lens array 20.

Up to this point, the side view and top view of the optical train and light rays 25 created are identical except for the laser beam 14 dimensions. The square beam will now be transformed into a narrow strip as described below.

An array 26 of cylindrical lenses 28 is located at the focal plane of lens 24, in this case 2,000 mm away. In one embodiment, array 26 consists of 13 cylindrical lenses, each cylindrical lens being 78 mm long and 6 mm wide. The cylindrical lenses 28 are arbitrarily oriented in the horizontal direction in FIG. 1A, which shows the ends of the 13 cylindrical lenses 28. The top view of FIG. 1B shows the top cylindrical lens 28 only. In one embodiment, the focal length along the vertical dimension of each cylindrical lens 28 is approximately +21 mm, and the focal length of each cylindrical lens 28 in the horizontal dimension is infinity.

Figure 5:
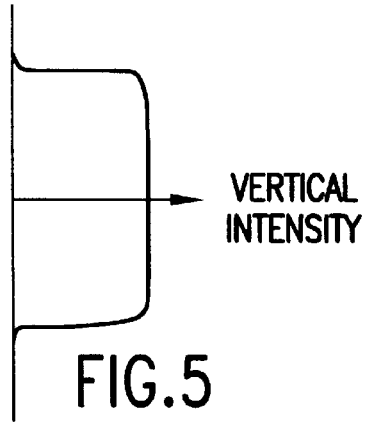
FIG. 5 illustrates the intensity of light incident upon the cylindrical lens array 26 in FIG. 1A along the vertical dimension.
Figure 6:
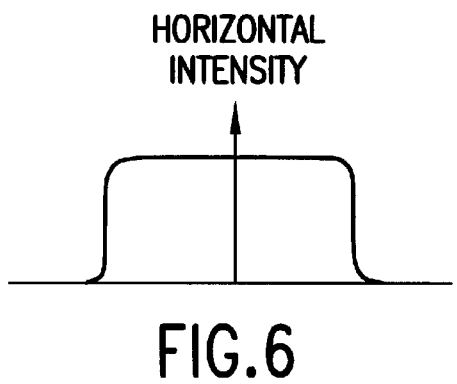
FIG. 6 illustrates the intensity of light incident upon the cylindrical lens array 26 along the horizontal dimension.

Since array 26 is located at the focal plane of lens 24, the light rays entering lens 24 from the 7×7 array 20 which have the same angle are focused by lens 24 at the same point along array 26. As an example, all lenses in a column of lenses in the 7×7 array 20 output a portion of their light, such as rays 30 and 32, which are incident upon lens 24 at the same angle. These rays, having the same angle, exiting a single column of lenses 21 are thus focused by lens 24 at approximately the same spot on the cylindrical lens array 26. Each of the lenses 21 in the 7×7 array 20 output a cone of light rays, and all these light rays in each cone are focused by lens 24 onto the cylindrical lens array 26 as dictated by the angle of incidence of these rays upon lens 24. In this manner, the intensity of the light beam across the cylindrical lens array 26 is made uniform by effectively averaging (by overlapping) the light output of each lens in the 7×7 array 20. FIGS. 5 and 6 illustrate the uniform intensity of light across array 26 in the vertical dimension and horizontal dimension, respectively.

It is to be understood that array 26 may consist of any number of cylindrical lenses. The cylindrical lens array 26 should be made large enough to receive all light output from lens 24.

A positive lens 40 is located beyond the focal plane of array 26. Since the focal length of array 26 is 21 mm, a suitable location for lens 40 may be 30–40 mm or greater from array 26. In one embodiment, lens 40 has a focal length of +367 mm and a diameter of 110 mm. It is generally not desirable to locate lenses 24 or 40 at the focal planes of their respective upstream lenses so that the power is somewhat diffused when incident upon lenses 24 and 40. In other embodiments, the focal length of lens 40 is between approximately 200–500 mm.

Light rays in FIG. 1A emanating from the edges of the end two cylindrical lenses in array 26 are shown which focus at a focal plane 21 mm from array 26.

Figure 7:
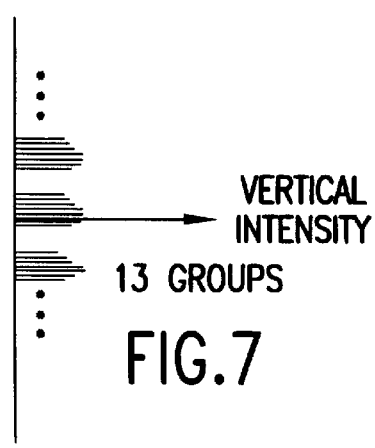
FIG. 7 illustrates the light intensity output from the cylindrical lens array 26 along the vertical dimension.

The light output from each cylindrical lens 28 in array 26 is uniform in the horizontal dimension so as to create 13 groups of narrow strips of light. Within each group, there are seven narrow strips representing light from the seven rows of lenses in the 7×7 array 20. These seven strips within each group are displaced slightly from each other because each of the point sources of light associated with each lens 21 in a column of the 7×7 array 20 is spatially shifted relative to the other point sources in the column, leading to slightly different incident angles upon the cylindrical lenses in array 26. The intensity of each of these seven strips along the vertical dimension, within the 13 groups of strips, is shown in FIG. 7, as would be measured at the focal plane 46 in FIG. 1A. This effect is minimized with a long focal length lens 24. The drawback of such a long focal length lens is the distance required and the larger physical size required of the cylindrical lens array 26. The lens 24 could be a compound lens with an effective focal length of 2 meters but occupying much less space.

Figure 8:
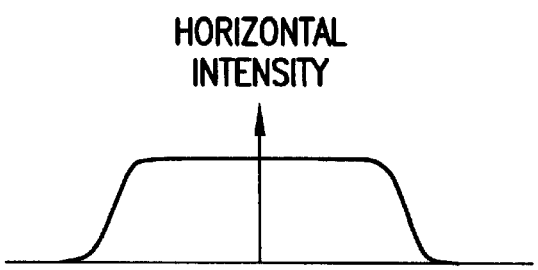
FIG. 8 illustrates the light intensity output from the cylindrical lens array 26 along the horizontal dimension.

The horizontal intensity of light at the focal plane of array 26 is shown in FIG. 8.

The light emanating from these 13 groups of seven strips (91 total) is then made incident on the lens 40 as previously described. Lens 40 performs the same function as the long focal length lens 24 to convert the angular spectrum of the light rays to spatial intensity at the focal plane of lens 40. The focal length of lens 40 should be as short as practical to reduce the extent of stair stepping at the edges of the beam, as described below.

A lens 44 is located at the focal plane (367 mm away) of lens 40. In one embodiment, lens 44 is an equiconvex positive lens having a focal length of +183 mm and a diameter of 110 mm.

FIG. 9 illustrates the intensity of the light incident upon lens 44 along the vertical dimension. The seven steps at the edges of the intensity profile are a by-product of the intensity profile shown in FIG. 7. This stair step is due to the fact that the rays from the 7×7 point sources of light created by array 20, after passing through lens 24, are not perfectly parallel to each other, and a slight angular difference translates to a spatial difference at the focal plane of lens 40. This stair step can be apertured at this plane or at the reticle plane and represents the first loss of energy within the optical train. This loss most likely can be made less than 10% of the total loss.

The top view of the optical train shown in FIG. 1B shows that the cylindrical lenses in array 26, with a focal length of infinity in the horizontal dimension, do not substantially alter the direction of light output from lens 24 along the horizontal dimension. This causes the light rays to be focused by lens 40 in a small area (e.g., 7 mm in the horizontal dimension) upon lens 44. The light incident on lens 44 in FIG. 1B actually consists of a set of seven intensity spikes along the horizontal dimension due to the seven columns in the 7×7 lens array 20. The intensity pattern in the horizontal dimension of the light incident upon lens 44 in FIG. 1B is shown in FIG. 10. These spikes can be smoothed out by placing a weak diffuser 47 in the same plane as the cylindrical lens array 26.

This diffuser 47 will destroy the nearly collimated nature of the light incident on array 26 and lead to a Gaussian shaped intensity profile of the light incident upon lens 44. Since this Gaussian profile must be clipped or apertured at some level, there will be a loss of energy. This represents the second loss of energy within the optical train. Clipping at the 30% level leads to a 24% loss of energy. This causes the total theoretical efficiency of the system to be 0.9*0.67=0.684, or 68.4% efficient.

The remainder of the lenses in the optical train are used to transfer the uniform illumination plane exciting lens 44 onto a reticle. This intermediate imaging can be used to achieve the proper illumination region size and to choose the size of the illumination cone.

The equiconvex lens 48 is identical to lens 44, having a focal length of 183 mm, and is positioned two focal lengths away from lens 44. These lenses 44 and 48 may be other sizes in order to properly interface with the scanner projection optics, which focus the reticle image onto a wafer. Thus, in order to properly design the optical train, the projection optics of the scanner must be previously known and the optical train designed starting from the left most side of FIGS. 1A and 1B. Lens 48 is conjugate to the entrance pupil of the projection lens of the scanner, and, thus, the illumination pattern will be replicated at the entrance pupil. The spatial uniformity at lens 48 represents the angular uniformity at the reticle 50.

The uniform intensity along the horizontal dimension of the light incident upon lens 48 is similar to that shown in FIG. 6. The vertical intensity pattern incident upon lens 48 consists of 13 groups of seven spikes similar to that shown in FIG. 7. Each of the 13 groups has equal intensity due to the uniform illumination incident on the cylindrical lens array 26. The individual spikes may be smoothed together by the weak diffuser 47 described above. The diffuser 47 does not necessarily improve the uniformity in the horizontal direction. It is primarily used to smooth or merge the individual spikes of FIG. 7. A diffuser may not even be necessary if the laser beam's divergence is high enough to make all the spikes merge together.

The overall shape of the light intensity incident upon lens 48 is square. If a traditional pupil fill shape is required, a circular aperture can be placed at lens 48 to create a circular pupil fill, for an additional loss of 21.5%, leading to a 53.7% overall system efficiency. The square pattern at lens 48 has an advantage if newer illumination schemes, such as quadrupole illumination are desired. Quadrupole illumination consists of four circular spots of illumination placed at the four corners of a square. Thus, the square illumination pattern can easily be apertured to achieve quadrupole illumination.

A field lens 54 is spaced from lens 48 at twice the focal length (i.e., 2×183 mm) of lens 48. The function of a field lens is well known and is used to suitably redirect the light rays such that the light rays are symmetrical about a center line, and the center line of the light rays is normal to the reticle 50. Field lens 54 may be conventional and may be formed of a number of lenses, as would be well known to those skilled in the art. The focal length of the field lens 54 is chosen such that the reticled image is suitably provided to the pupil of the scanner's imaging optics (not shown).

FIG. 11 is a front view of the resulting illumination light 60 incident upon reticle 50. The illumination light 60 is a relatively narrow beam of light (e.g., 7 mm), having a vertical height (FIG. 1A) approximately that of the exposure area on the reticle 50 (e.g., 120 mm). The orientation of the illumination light is dependent upon the scanner. In a typical scanner, the illumination light will remain stationary while the reticle 50 and wafer are moved together to expose the wafer.

The uniformity of the illumination light 60 in the present design is excellent along the vertical dimension, and, since this illumination design is intended for scanners, good spatial uniformity is only required along the long axis. The light intensity incident on reticle 50 is the same at all positions along reticle 50, and the incident light exhibits equal energy weighting versus incident angle. The various advantages of this design include:

1) High uniformity of the illumination light perpendicular to the scanning direction.
2) The use of only low numerical aperture optics makes for inexpensive construction and extendibility to very large numerical aperture microlithography systems.
3) The uniform plane of illumination at lens 44 is conjugate to the reticle 50 plane with a magnification of one. Aperture plates can be placed at this plane for easy adjustment of the size and shape of the illumination plane. Since this plane is exactly conjugate with the reticle plane, the penumbra (aperture blur) will be low.
4) The lenses 40 and 44 may be made into zoomable optical elements, allowing the system to change the size of the pupil fill to match the desired pupil fill size for a given feature type and resolution.
5) High theoretical efficiency.
6) Uniform illumination at both the reticle plane and the objective pupil plane of the projection optics.
7) A square pupil fill may be obtained to accommodate quadrapole illumination schemes.

FIG. 12 illustrates a scanner system 70 incorporating the illumination system 10 of the present invention. A mirror 72 or other beam redirecting components, such as prisms, may be used to avoid a straight optical path from the illumination source to the reticle 50. The imaging optics 76 for the scanner 70 focuses the reticle image onto the wafer 80 surface. A drive mechanism (not shown) scans reticle 50 and wafer 80 relative to the illumination light so as to uniformly expose the wafer surface to the reticle pattern.

Scanner 70 in one embodiment also provides a step-and-repeat mechanism such that reticle 50 only exposes a small portion of the wafer 80 surface, and wafer 80 is then stepped to a new reference location for a next scan across a portion of the wafer.

Additionally information regarding scanners may be found in U.S. Pat. Nos. 5,194,893 and 4,924,257, and the paper entitled "Step-and-Scan Lithography Using Reduction Optics," by Buckley et al., J. Vac. Sci. Technology, Nov/Dec 1989, pages 1607–1612, all incorporated herein by reference.

While particular embodiments of the present invention have been shown and described, it will be obvious to those skilled in the art that changes and modifications may be made without departing from this invention in its broader aspects. For example, the various lenses need not be equiconvex to achieve the same functions, and their focal lengths may be changed. Further, additional lenses may be used in the system, and a compound lens may be substituted for a single lens. Therefore, the appended claims are to encompass within their scope all such changes and modifications as fall within the true spirit and scope of this invention.

What is claimed is:

1. An optical system disposed between a light source and a reticle pattern in a scanning microlithograpy system comprising:

a two dimensional array of lenses for receiving light from a light source;

a first positive lens having a first focal length, said first positive lens being placed a distance from said two dimensional lens array which is less than said first focal length;

an array of cylindrical lenses placed at approximately said first focal length from said first positive lens;

a second positive lens having a second focal length, said second positive lens being placed at a distance from said array of cylindrical lenses which is less than said second focal length; and one or more additional lenses for illuminating a reticle pattern in a scanning microlithography system, light illuminating said reticle having an oblong shape for scanning with respect to said reticle.

2. The system of claim 1 wherein said light source comprises a laser.

3. The system of claim 2 further comprising an anamorphic expander positioned between said laser and said two dimensional array of lenses for causing a laser beam output from said laser to have a substantially square cross-sectional area.

4. The system of claim 1 wherein said first focal length is approximately 2,000 mm.

5. The system of claim 1 wherein said first focal length is greater than approximately 1,000 mm.

6. The system of claim 1 wherein a distance of said first positive lens from said two dimensional array of lenses is greater than a focal length of said array of lenses.

7. The system of claim 1 further comprising a light diffuser positioned between said first positive lens and said array of cylindrical lenses.

8. The system of claim 1 wherein said second focal length of said second positive lens is between approximately 200 mm and 500 mm.

9. The system of claim 1 wherein a distance of said second positive lens from said array of cylindrical lenses is greater than a focal length of each of said cylindrical lenses.

10. The system of claim 1 wherein said one or more additional lenses includes a field lens.

11. The system of claim 1 wherein said one or more additional lenses comprises:

a third positive lens having a third focal length spaced approximately at said second focal length from said second positive lens; and a fourth positive lens having said third focal length and spaced approximately twice said third focal from said third positive lens.

12. The system of claim 11 future comprising a field lens spaced from said fourth positive lens by approximately twice said third focal length.

13. The system of claim 1 wherein said first positive lens is a single lens.

14. The system of claim 1 wherein each of said cylindrical lenses has an axis, said light having an oblong shape having a long dimension and a short dimension, said axis being substantially perpendicular to said long dimension.

15. A method performed by an optical system disposed between a light source and a reticle pattern in a scanning microlithograpy system comprising:

providing a collimated light beam from a light source;

applying said light beam to a two dimensional array of lenses;

applying light exiting said array of lenses to a first positive lens having a first focal length, said first positive lens being placed a distance from said two dimensional lens array which is less than said first focal length;

applying light exiting said first positive lens to an array of cylindrical lenses placed at approximately said first focal length from said first positive lens;

applying light exiting said array of cylindrical lenses to a second positive lens having a second focal length, said second positive lens being placed at a distance from said array of cylindrical lenses which is less than said second focal length; and applying light exiting said second positive lens to one or more additional lenses for illuminating a reticle pattern in a scanning microlithography system, light illuminating said reticle having an oblong shape for scanning with respect to said reticle.

16. The method of claim 15 wherein said first focal length is greater than approximately 1000 mm.

\* \* \* \* \*